US009497883B2

(12) United States Patent
Tetsuo et al.

(10) Patent No.: US 9,497,883 B2
(45) Date of Patent: Nov. 15, 2016

(54) NOISE SUPPRESSION CIRCUIT BOARD DESIGN FOR AN INDUCTIVE HEATER

(71) Applicants: Yokoyama Tetsuo, Osaka (JP); Sanamoto Masashi, Osaka (JP)

(72) Inventors: Yokoyama Tetsuo, Osaka (JP); Sanamoto Masashi, Osaka (JP)

(73) Assignee: HAKKO CORP., Osaka (JP)

( * ) Notice: Subject to any disclaimer, the term of this patent is extended or adjusted under 35 U.S.C. 154(b) by 401 days.

(21) Appl. No.: 14/223,668

(22) Filed: Mar. 24, 2014

(65) Prior Publication Data

US 2015/0271912 A1    Sep. 24, 2015

(51) Int. Cl.
| | | |
|---|---|---|
| H05B 6/04 | (2006.01) | |
| H05B 6/06 | (2006.01) | |
| H05K 1/02 | (2006.01) | |
| H05K 7/06 | (2006.01) | |
| H05K 7/20 | (2006.01) | |
| H05K 1/18 | (2006.01) | |

(52) U.S. Cl.
CPC .............. *H05K 7/20* (2013.01); *H05K 1/0225* (2013.01); *H05K 1/0203* (2013.01); *H05K 1/0243* (2013.01); *H05K 1/0298* (2013.01); *H05K 1/182* (2013.01); *H05K 2201/066* (2013.01); *H05K 2201/10166* (2013.01)

(58) Field of Classification Search
CPC .... H05K 1/0225; H05K 7/20; H05K 1/0203; H05K 1/0243; H05K 2201/10166; H05K 1/182; H05K 2201/066; H05K 1/0298
USPC ........... 219/663, 660, 622–623, 677, 121.36; 361/160, 752, 760, 761, 763, 720; 174/251, 254, 255, 260
See application file for complete search history.

(56) References Cited

U.S. PATENT DOCUMENTS

| | | | | |
|---|---|---|---|---|
| 8,426,781 B2* | 4/2013 | Kim | ..................... | H05B 6/1263 126/21 A |
| 2007/0297154 A1* | 12/2007 | Caruba | ................ | H05K 1/0218 361/760 |
| 2010/0237064 A1* | 9/2010 | Liu | ...................... | H05B 6/1209 219/622 |

* cited by examiner

*Primary Examiner* — Quang Van

(57) ABSTRACT

A noise suppression circuit board design to provide a power supply to an inductive heating element is disclosed. The noise suppression circuit provides a configuration for a multi-layer circuit board that has radiation noise emissions below the CISPR 11 (limits and methods of measurements of radio disturbance characteristics of industrial, scientific and medical (ISM) radio-frequency equipment) thresholds in the 30 MHz to 1 GHz frequency range.

20 Claims, 10 Drawing Sheets

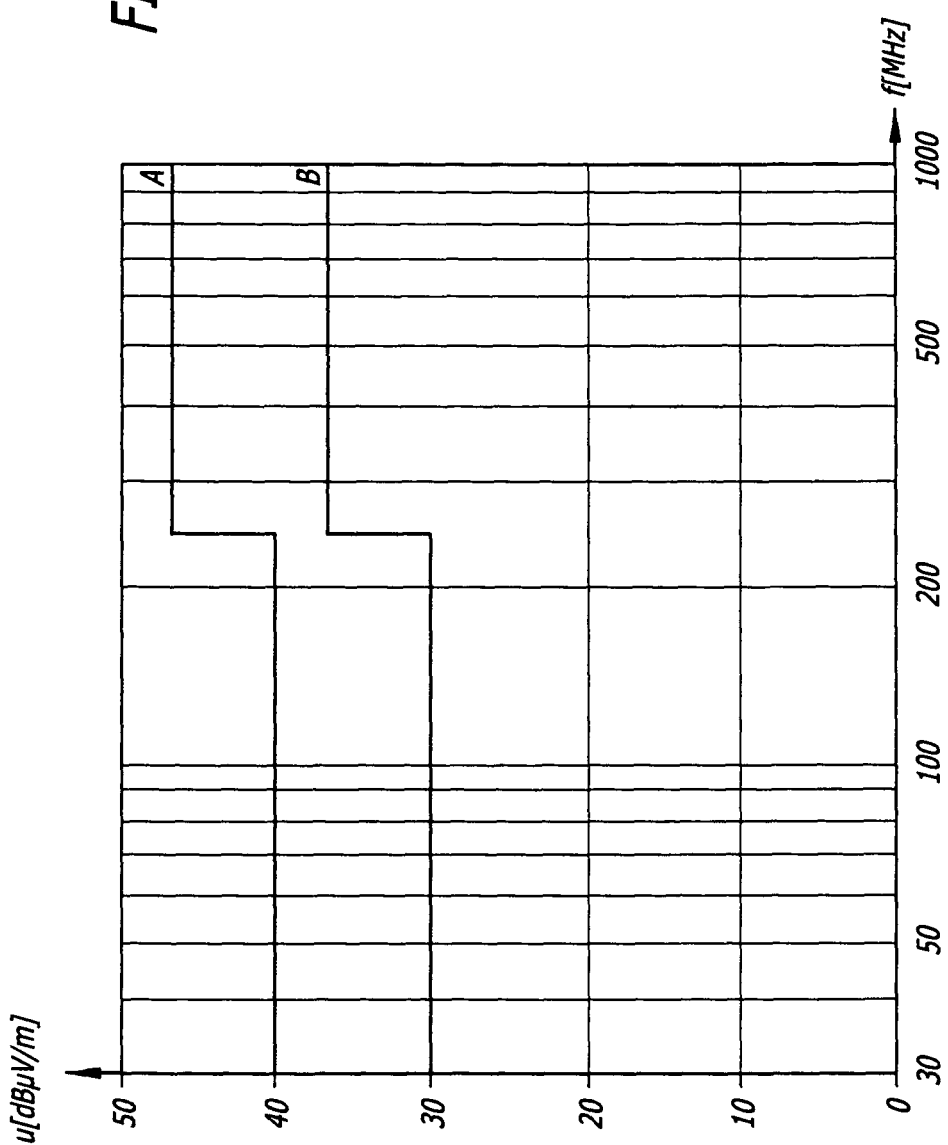

NOISE SUPPRESSION CIRCUIT BOARD DESIGN FOR AN INDUCTIVE HEATER

BACKGROUND OF THE INVENTION

It is well known that electrical equipment will generate electromagnetic emissions, including radio frequency emissions of radio frequency interference ("RFI"). RFI is an electromagnetic disturbance which is generated by electrical apparatus and can be received by and effect other equipment. In power supplies, the RFI is most commonly generated by the switching devices. Steep voltage steps and high switching frequencies increase the high frequency content of RFI disturbances. The RFI disturbances can couple to other components in the power supply, producing noise radiation over a broad frequency spectrum.

International basic emissions standards have been prepared by the "Comité international spécial des perturbations radioélectriques—International special committee of radio interferences" or "CISPR" and adopted by national and international authorities. CISPR 11 applies to industrial, scientific and medical electrical equipment operating in the frequency range 0 Hz to 400 GHz and to domestic and similar appliances designed to generate and/or use locally radio-frequency energy. CISPR 11 also cover emission requirements related to radio-frequency (RF) disturbances in the frequency range of 9 kHz to 400 GHz. The graph of FIG. 10 generally depicts the CISPR 11 disturbance field strength limits.

The CISPR 11 limits are applicable to inductive heating devices, such as inductive heated soldering stations that fall under the category of industrial equipment. Similar standards apply to inductive cooking system. RFI emissions from these types of inductive heating systems is a concern as the inductive heating systems include a power supply that provides a high frequency alternating (AC) current to a heater coil assembly. Also, in order to control temperature, the high frequency AC current may be pulsed on and off, providing very steep voltage steps. Accordingly, the circuit design for inductive heating devices disclosed herein contemplates isolating the causes of RFI emissions so as to attempt to minimize the RFI disturbances.

SUMMARY OF THE INVENTION

The present invention is directed to design features that may be implemented in a multi-layer circuit board so as to reduce the radiation noise to levels compatible with the CISPER 11 requirements in the 30 MHz to 1 GHz frequency range. The circuit design features include laying out the circuit components onto sections of the circuit board and segregating the ground patterns of the copper foil of the circuit board with cut lines etched through the copper foil of the ground pattern to define respective sections or zones in the circuit board for mounting discrete circuit components. The circuit design features also include incorporating a comparatively thick heat dissipation sheet of insulation material between transistor components and a heat sink.

BRIEF DESCRIPTION OF THE FIGURES

The following drawings are not necessarily to scale, emphasis instead being placed generally upon illustrating the principles of the invention. The foregoing and other features and advantages of the present invention, as well as the invention itself, will be more fully understood from the following description of preferred and exemplary embodiments, when read together with the accompanying drawings, in which:

FIG. 10 is a graph depicting the CISPR 11 disturbance field strength limits.

DETAILED DESCRIPTION

Figure 1:
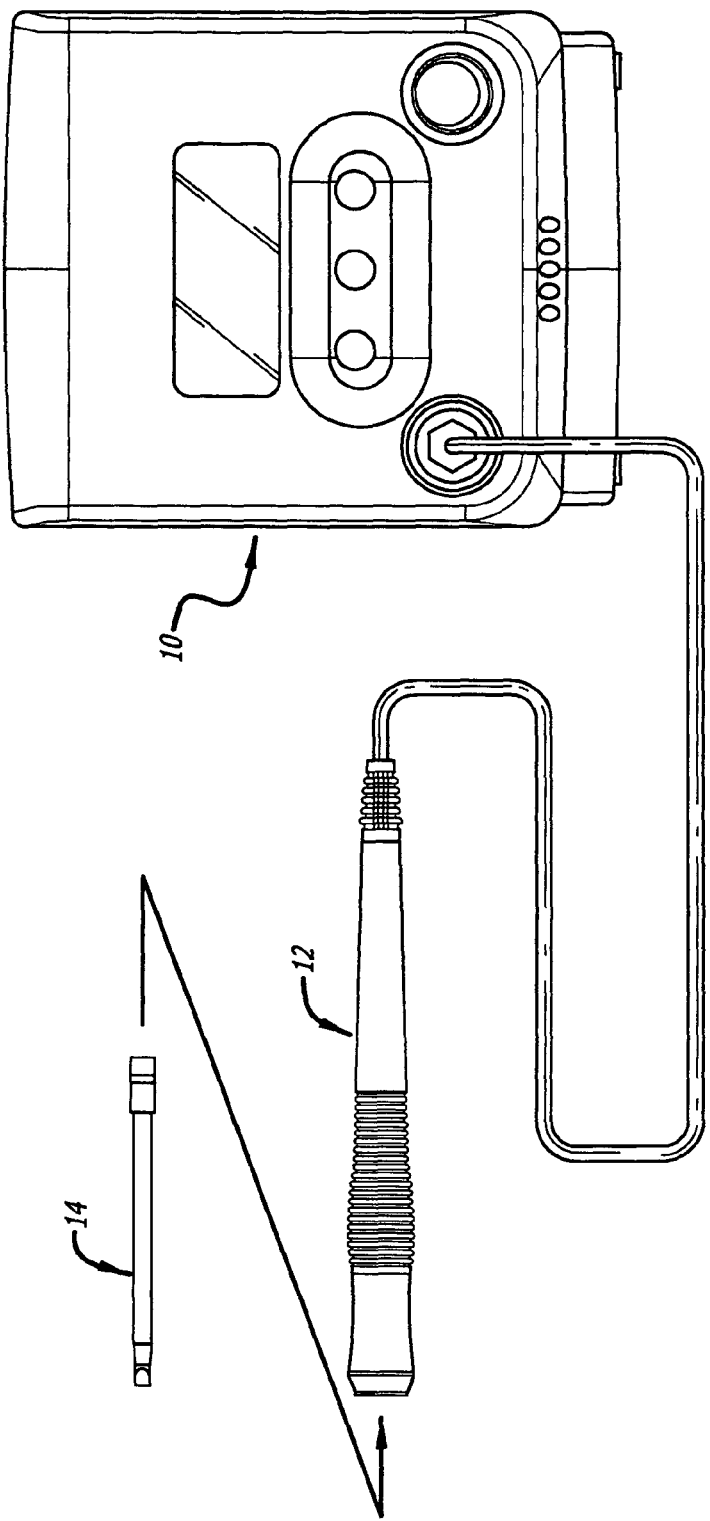
FIG. 1 is a perspective view of an inductive solder station, handle and an inductive heater cartridge assembly.

FIG. 1 illustrates an exemplary inductive heating assembly incorporating an embodiment of the present invention. As shown in FIG. 1, the inductive heating assembly is depicted as an inductive soldering station 10 having a removable cabled handle 12 that may receive and power an inductive heater cartridge assembly 14. The solder station 10 provides a high frequency AC current to the heater cartridge assembly 14 to heat and control the temperature of the tip of the heater cartridge assembly 14. The solder station 10 includes power supply and control circuitry mounted on a four layer circuit board 20, having circuit layout structures as shown in the plan views of FIGS. 2 through 5.

Figure 2:
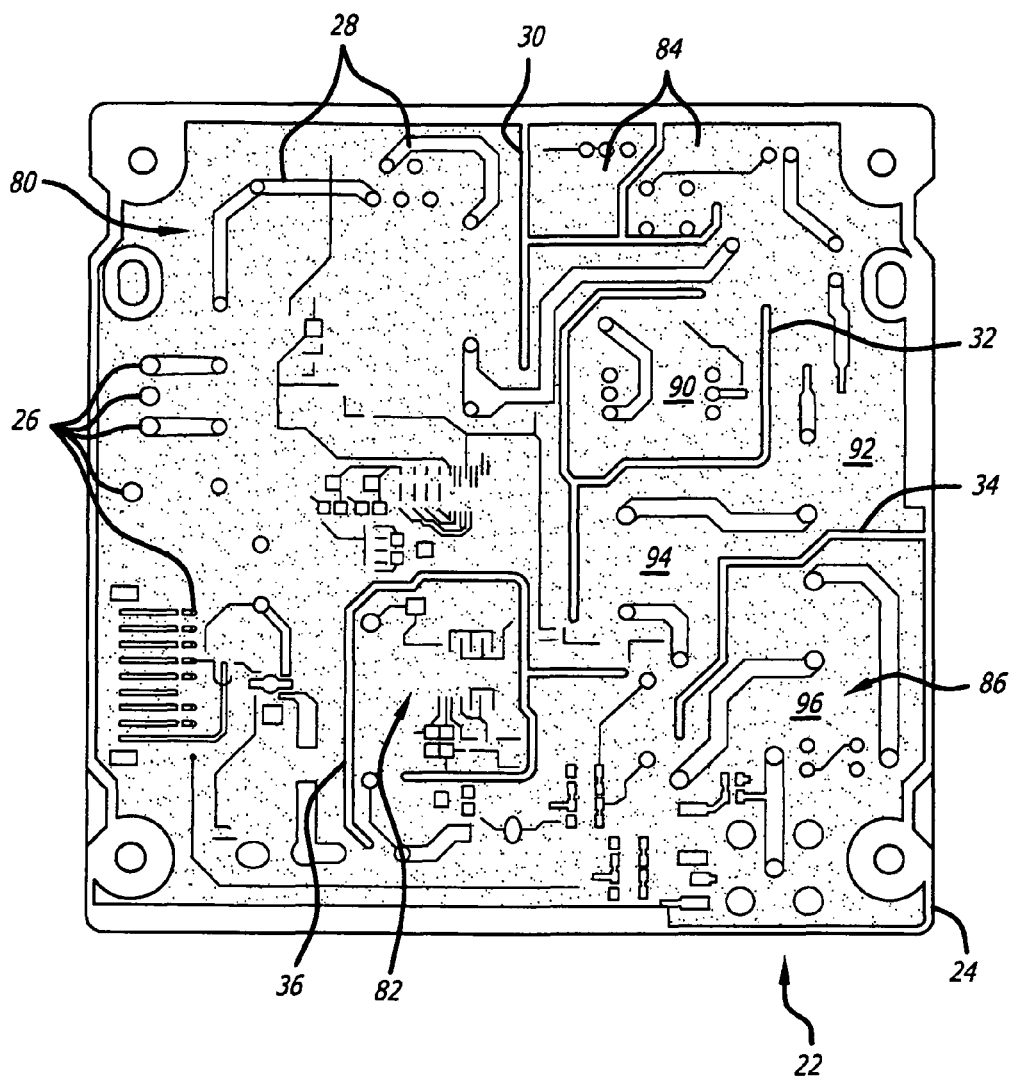
FIG. 2 is a plan view of the top layer of a four layer circuit board suitable for providing the power supply for the inductive solder station of FIG. 1.

FIG. 2 is a top side plan view of the top layer 22 of the four layer circuit board 20 suitable for mounting the electrical components providing the power supply and control circuitry for the inductive heating assembly, depicted as the inductive solder station of FIG. 1. As depicted in FIG. 2, the top layer 22 includes core 24 that may be formed from a laminated glass epoxy, and including an etched copper foil having a plurality of holes, or as commonly known in the field, a plurality of vias 26, and circuit trace lines 28 defined by etching the copper foil to allow for the mounting and appropriate interconnection of circuit components. As also depicted in FIG. 2, the top layer has four ground cut lines 30, 32, 34 and 36, respectively, that separate and isolate the ground pattern into different portions or zones of the four layer circuit board 20 and define the layout of the locations of the various circuit subsystems, as described below. The ground cut lines 30, 32, 34 and 36 extend through the copper foil to expose the underlying glass epoxy core.

Figure 3:
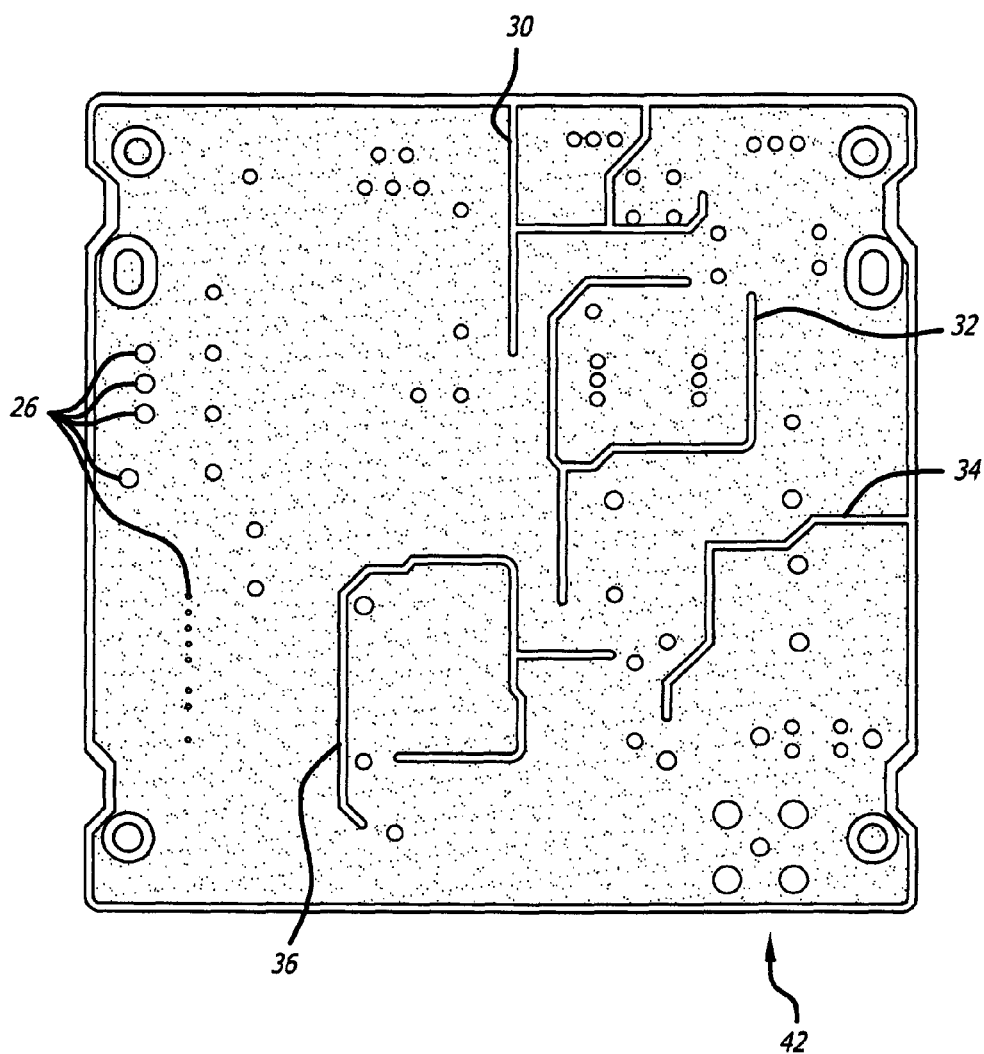
FIG. 3 is a plan view of the first mid layer of a four layer circuit board suitable for providing the power supply for the inductive solder station of FIG. 1.

FIG. 3 is a top side plan view showing the features of the first mid layer 42 of the four layer circuit board 20. As illustrated, the mid layer 42 also includes the plurality of vias 26 positioned so as to match the vias 26 of the top layer 22. The view of the first mid layer 42 also shows the locations of the ground cut lines 30, 32, 34 and 36 that are etched through the copper foil of the top layer 22 and first mid layer 42. While as depicted the first mid layer does not include circuit trace lines, they may be included if appropriate for the circuit design.

Figure 4:
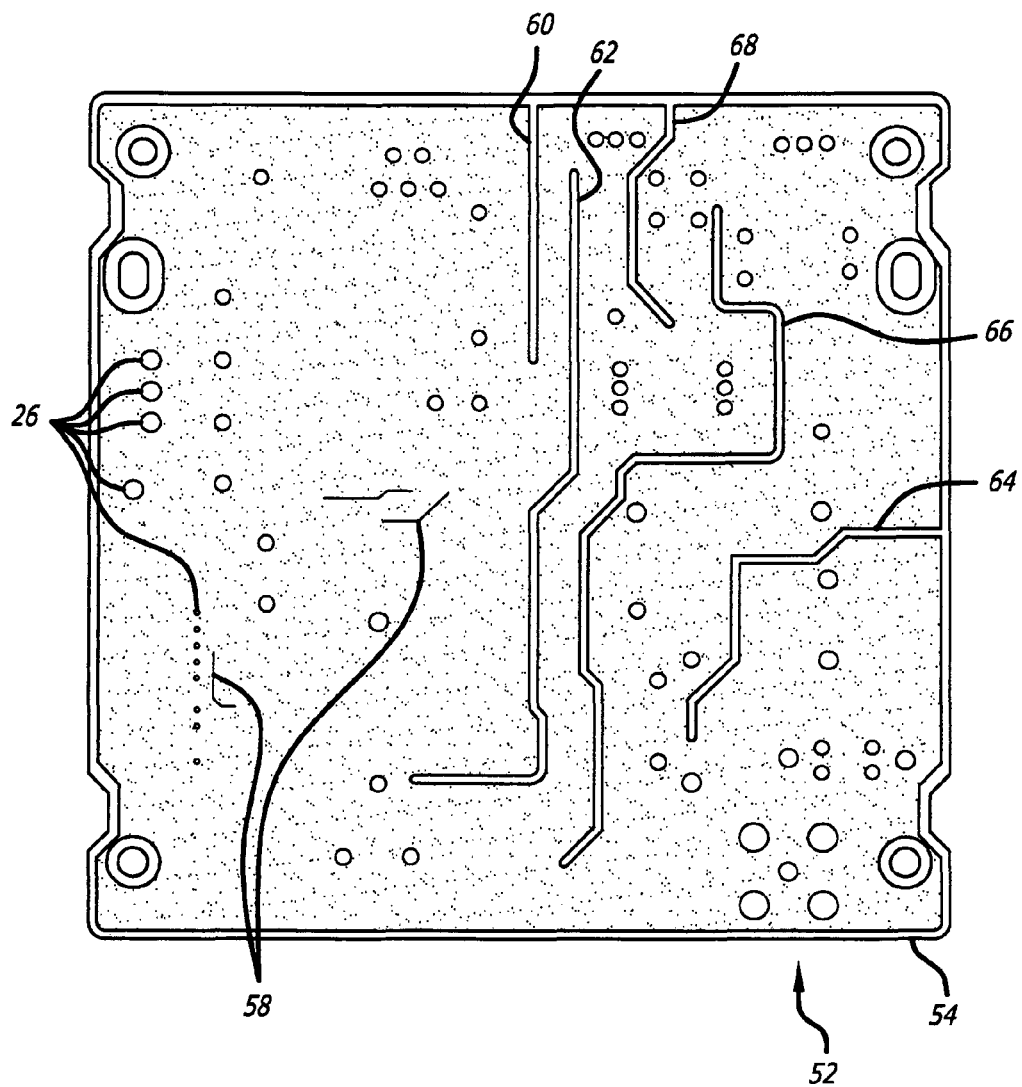
FIG. 4 is a plan view of the second mid layer of a four layer circuit board suitable for providing the power supply for the inductive solder station of FIG. 1.

FIG. 4 is a top side plan view of the second mid layer 52 of the four layer circuit board 20. As illustrated, the second mid layer 52 also includes a laminate 54 and the plurality of vias 26 positioned so as to match the vias 26 of the top layer 22 and first mid layer 42 for the mounting of the circuit elements. As depicted, the second mid layer 52 also includes circuit trace lines 58, interconnecting select vias 26. The view of the second mid layer 52 also shows the positions of a second set of ground cut lines 60, 62, 64, 66 and 68, respectively. These ground cut lines are etched through the copper foil of the second mid layer to match the ground cut lines 60, 62, 64, 66 and 68, respectively etched through the copper foil of the laminated core of the bottom layer as depicted in FIG. 5 and described below.

Figure 5:
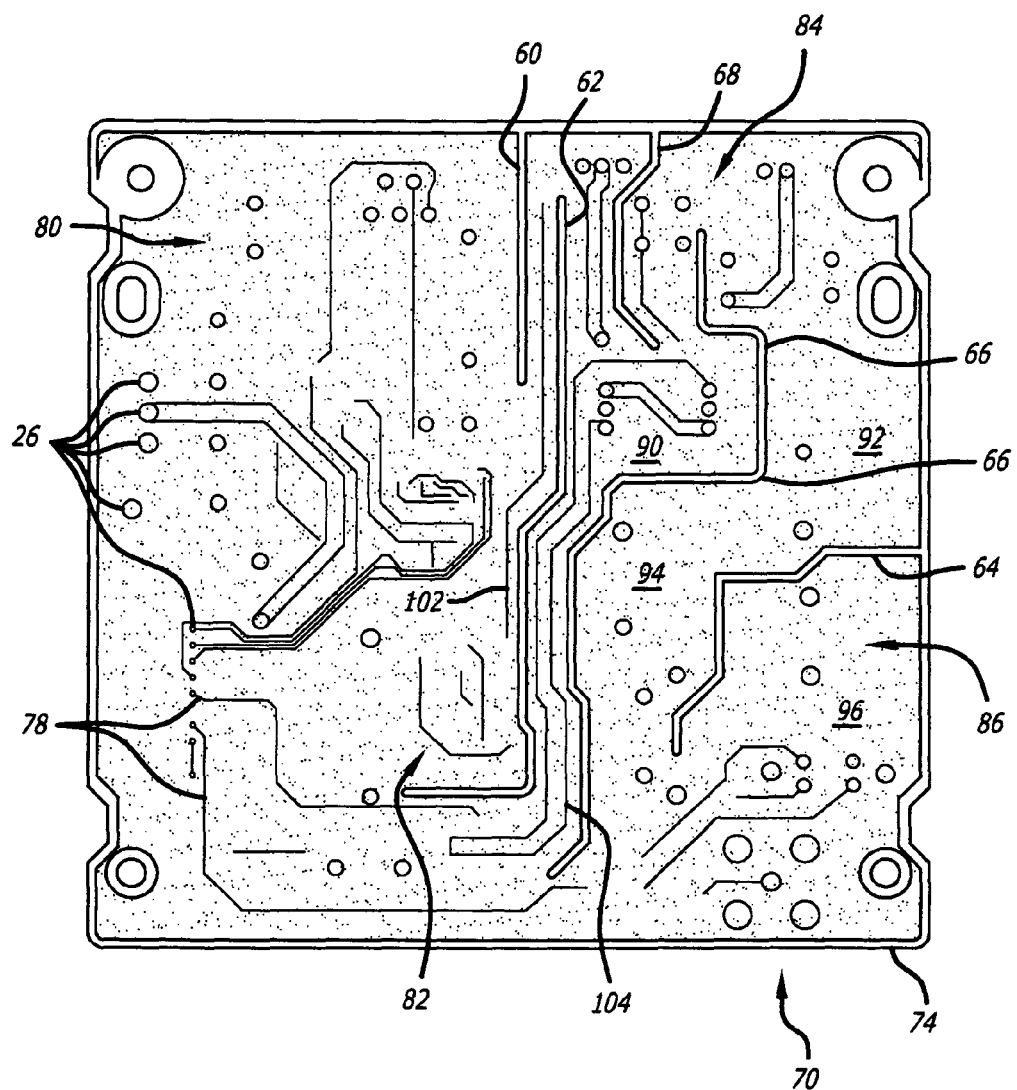
FIG. 5 is a plan view of the bottom layer of a four layer circuit board suitable for providing the power supply for the inductive solder station of FIG. 1.

FIG. 5 is a top side plan view of the bottom layer 70 of the four layer circuit board 20. As illustrated, the bottom layer 70 also shows the laminated core 74 that may be formed from a glass epoxy, and the plurality of vias 26 positioned so as to match the vias 26 of the top layer 22, first mid layer 42, and second mid layer 52, allowing for the mounting of the circuit components. As depicted, the bottom layer 70 also includes a plurality of circuit trace lines 78 interconnecting select vias 26. The view of the bottom layer 70 also shows the second set of ground cut lines 60, 62, 64, 66 and 68, respectively, extending through the copper foil on the laminated core 74.

As known in the art of multi-layer circuit board fabrication, the first mid layer 42 and the second mid layer 52 would be separated by a core or laminate material (not shown) to isolate the respective mid layers. The core would include the vias 26 to allow mounting of the circuit components. As may be appreciated from a comparison of the locations of the ground cut lines ground cut lines 30, 32, 34 and 36 of FIGS. 2 and 3 as against the locations of the ground cut lines 60, 62, 64, 66 and 68 of FIGS. 4 and 5, the respective ground cut lines are not necessarily identically positioned. As depicted, the respective ground cut lines may or may not be not be identically shaped or positioned to accommodate the circuit trace lines on the respective top layer 22 and bottom layer 70 surfaces that interconnect various circuit elements. In the configuration of FIGS. 2-5, only ground cut line 34 on the top layer 22 and ground cut line 64 on the bottom layer 70 are identically shaped and positioned.

Figure 6:
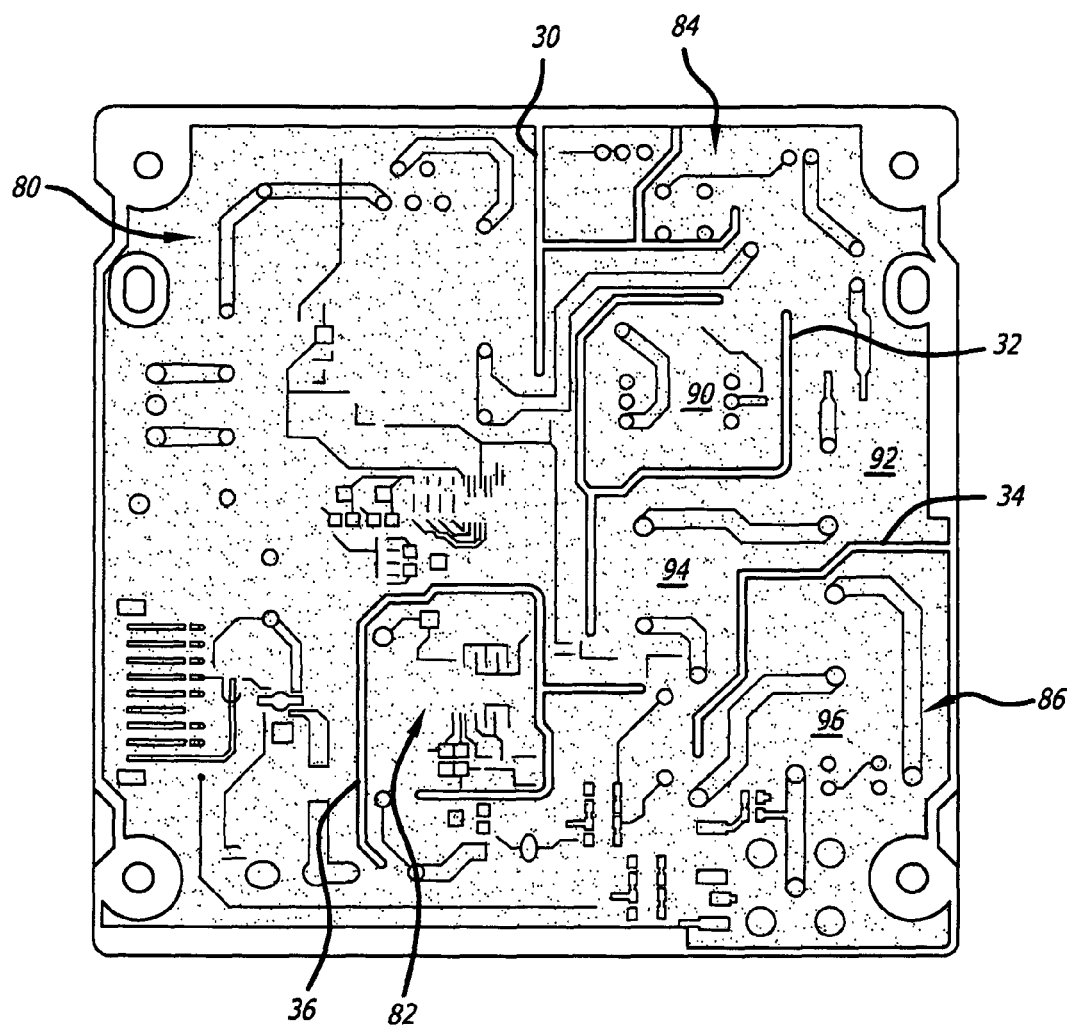
FIG. 6 is a plan view of the top layer of the four layer circuit board of FIG. 2, showing the circuit mounting zones generally defined by the configurations of the respective ground cut lines.

FIG. 6 is another plan view of the top layer 22 of the four layer circuit board 20 of FIG. 2, showing four primary circuit mounting zones generally defined by the configurations of the respective ground cut lines. The ground cut lines 30, 32, 34 and 36 segregate the top layer 22 into four primary zones for cluster mounting the circuit components that provide various functions of the induction heating device circuitry mounted on the four layer circuit board 20. Segregating the ground pattern of the top layer 22 into the four primary zones, separated by the ground cut lines, and strategically placing the circuit components providing the various functions required of the induction heating device decreases the RFI emissions.

The first primary zone 80 comprises most of the left side (as viewed in FIG. 6) of the top layer 22 of the four layer circuit board 20. The first primary zone is roughly defined on its right side by the left-most vertical portions of ground cut lines 30, 32 and 36 as well as the upper horizontal portion of ground cut line 36. Generally, the circuit components mounted in the first primary zone 80 include the power supply components for the inductive heating assembly. Accordingly, the top portion of primary zone 80 may include the DC power rectification circuitry. The middle portion of primary zone 80 may include the mode switchover circuitry and the bottom left portion of primary zone 80 may include the power source for the driver circuit.

The second primary zone 82 generally comprises the section of the top layer 22 within the generally box shaped portion of ground cut line 36, at the lower center section of top layer 22. The circuit components mounted in the second primary zone 82 are limited to the oscillator circuitry, including a crystal oscillator that may preferably provide a 13.56 MHz output.

The third primary zone 84 generally comprises the upper right corner of the top layer 22 including the section confined within the box shaped portion of ground cut line 30, and the right corner of the top layer 22 to the right of ground cut line 30. The circuit components mounted in the third primary zone 84 include the transistor for the inductive heater driver circuits to amplify the signal from the oscillator circuit and transistor amplifier circuits to amplify the signal derived from the driver circuit.

The fourth primary zone 86 generally comprises the remainder of the top layer 22, which physically consists of the right side of the top layer below the horizontal portion of ground cut line 30. The fourth primary zone 86 is further segregated into sub-zones, including sub-zone 90, bounded by the almost closed box shaped section of ground cut line 32, sub-zone 92 positioned to the right of sub-zone 90 and ground cut line 32, sub-zone 94 positioned below ground cut line 32 and above ground cut line 34, and sub-zone 96 generally including the lower right corner of the top layer 22 below the ground cut line 34. The circuit components mounted within the sub-zone 90 of the fourth primary zone 86 include an coil-capacitor circuit portion of the driver circuitry. The circuit components mounted within the sub-zones 92, 94 and 96 of the fourth primary zone 86 generally include a coil capacitor circuit portion of the amplifier circuit and filter circuitry in sub-zone 92 and sub-zone 94. The circuit components mounted within the sub-zone 96 include a second filter circuit and control circuitry for the induction heating device. Each of these circuitry subsystems may include a coil-capacitor circuit component mounted on respective paired vias. The respective ground cut lines defining the sub-zones isolate the ground pattern of the coil-capacitor circuit components from one another.

Figure 7:
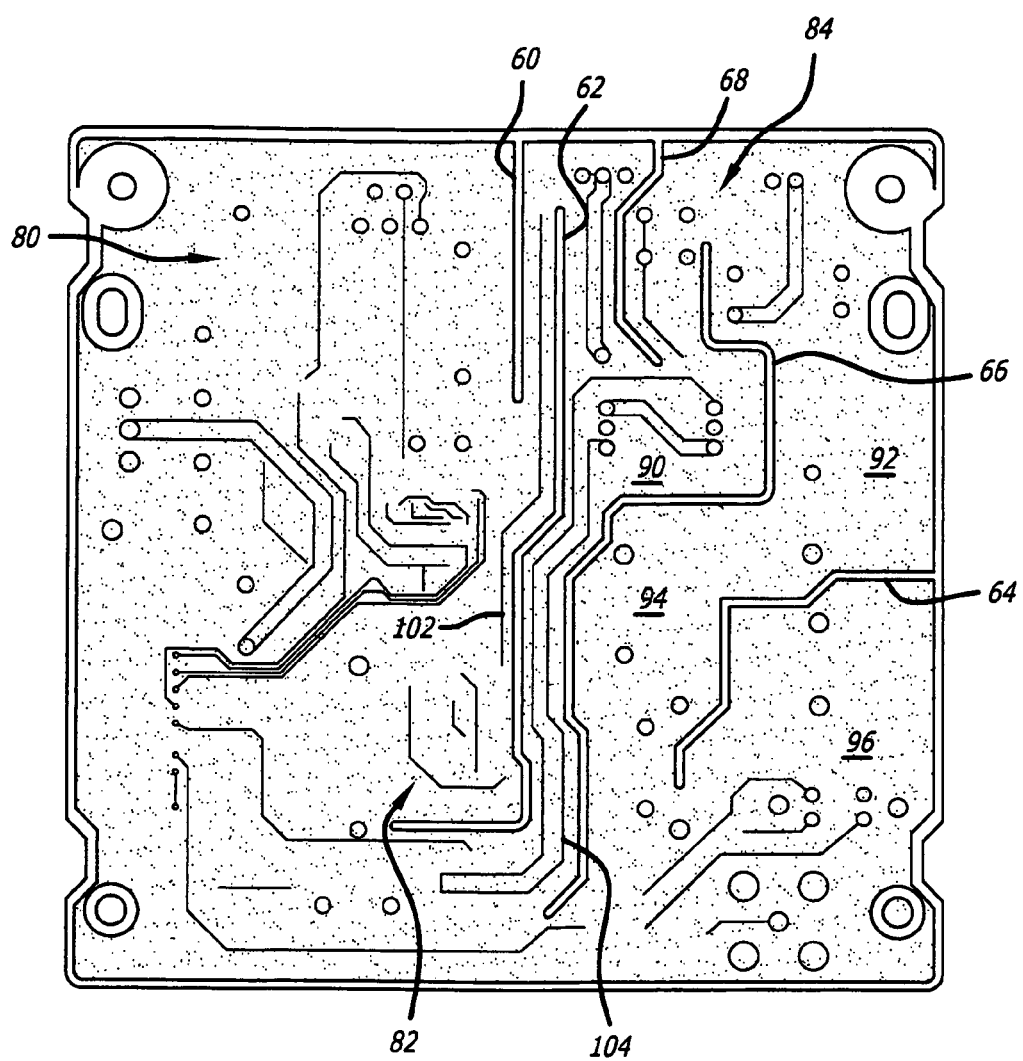
FIG. 7 is a plan view of the bottom layer of the four layer circuit board of FIG. 2, showing the circuit mounting zones generally defined by the configurations of the respective ground cut lines.

FIG. 7 is a plan view of the bottom layer 70 of the four layer circuit board 20 of FIG. 5, showing the four primary circuit mounting zones generally defined by the configurations of the respective ground cut lines. As depicted in FIG. 7, the first primary zone 80 and second primary zone 82 occupy the entire left side of the bottom layer 70, bounded at approximately the center line by ground cut lines 60 and 62 and the bottom portion of ground cut line 66. As illustrated best in FIG. 7, the bottom layer 70 has circuit trace 102 extending from the second primary zone 82 up to the third primary zone 84 at the top right side of the bottom layer 70. Circuit trace 102 runs along ground cut line 62, and in an upper portion circuit trace 102 is positioned between ground cut line 62 and ground cut line 60. Similarly, as also depicted in FIG. 7, the bottom layer 70 includes circuit trace 104 extending from the second primary zone 82 up along the left side of the fourth primary zone 86 to the inductive coil-capacitor circuit portion of the driver circuitry mounted in sub-zone 90. The circuit trace 104 is bounded between ground cut lines 62 and 66 on the bottom layer 70. The circuit traces 102 and 104 interconnect the oscillator circuits mounted in the second primary zone 82 to the driver circuits mounted in primary zone 84 and sub-zone 90, conducting the high frequency AC signals from the oscillator to the driver circuits. As the circuit traces 102 and 104 conducting the high frequency AC signal may be the source of RFI emissions, bounding the circuit traces 102 and 104 between the ground cut lines is believed to reduce RFI emissions.

The fourth primary zone 86, as also depicted in FIG. 7, includes the sub-zones 90, 92, 94 and 96. Sub-zone 90 is generally defined by a portion of ground cut line 62 and an "L" shaped section of ground cut line 66. Sub-zone 92 is generally defined on its left side by the portion of ground cut line 62 bounding sub-zone 90 and on the right side by the edge of the circuit board. Sub-zone 94 is generally defined by the space between ground cut line 64 and ground cut line 66. Sub-zone 96 is generally defined as the lower right corner of the bottom layer 70, below the ground cut line 66. As may be appreciated from a comparison between the positions of the primary zones 80, 82, 84 and 86, as well as the positions of the sub-zones 90, 92, 94 and 96, the ground cut lines 60, 62, 64, 66 and 68 of the bottom layer 70 isolate the ground pattern of the inductive coil-capacitors mounted on the top layer 22 from one another.

Figure 8:
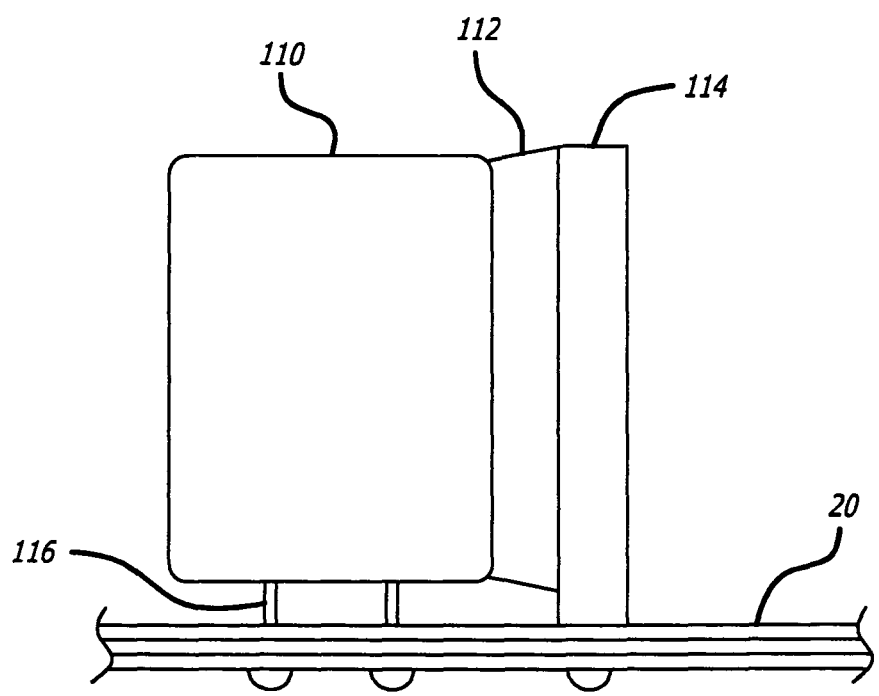
FIG. 8 is a side view schematic diagram of an assembly of a transistor, thermal interface and heat sink attached to the circuit board.

The electrical components providing the power supply and control circuitry for the inductive heater assembly include a plurality of transistors mounted in several locations on the top layer 22 of the circuit board 20. The locations of the transistors have been found to contribute to the RFI emissions in certain frequencies that may be generated by the inductive heater assembly. The FIG. 8 depicts a side view schematic diagram of an assembly of a transistor 110, thermal interface 112 and heat sink 114 attached to the circuit board 20 that has been found to reduce or eliminate these RFI emissions. The transistor 110 includes posts 116 to allow mounting on, and electrical connections to, the circuit board 20. Similarly, the heat sink has posts (not shown) that allow attachment to the circuit board 20. As depicted, the transistor 110 is separated from the thermal heat sink 114 by the thermal interface 112. The thermal interface 112 is made from a high hardness silicon rubber material suitable for acting as a thermal interface. The thick thermal interface depicted in FIG. 8 was found to reduce the capacitive coupling as between field effect transistors 110 and the heat sink 114, reducing the RFI emissions. The preferred thickness of the thermal interface depends upon the amount of the RFI emission level that may need to be limited. Increasing the thickness of the interface reduces the capacitive coupling, but increasing the thickness decreases the heat dissipation through the heat sink. The most suitable thickness for a particular application is thus dependent upon the desired emission suppression and required heat dissipation. In an exemplary embodiment, the thermal interface 112 has a thickness of about 0.8 mm. Preferably, the thermal interface 112 has a thickness of at least 0.7 mm and up to 1.0 mm for most applications.

Figure 9:
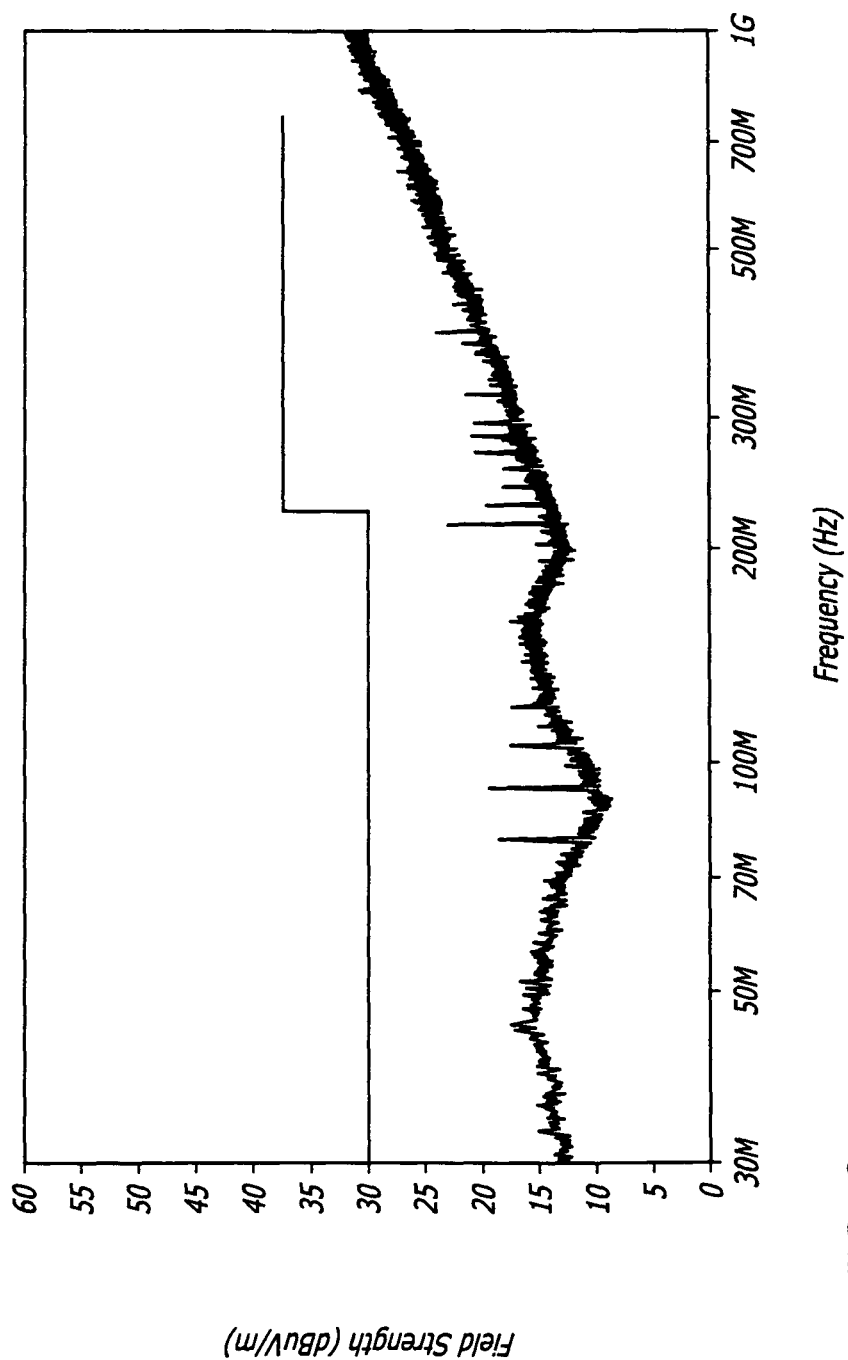
FIG. 9 is a Radiation Field Strength v. Frequency chart for the inductive soldering station using the circuit board design features described herein.

FIG. 9 is a chart depicting Frequency on the X-axis and RFI field strength on the Y-axis for the inductive heater assembly incorporating the features of the four-layer circuit board and circuitry described above. The chart of FIG. 9 includes the frequency range from 30 MHz to 1 GHz. The field strength is measured from 0 dBµV/m to 60 dBµV/m, according to the CISPR 11 standard. The RFI emissions of the inductive solder station are less than the maximum field strength levels for the entire frequency range from 30 MHz to 1 GHz.

Those skilled in the art will readily appreciate that the disclosure herein is meant to be exemplary and actual parameters and materials depend upon the specific application for which the process and materials of the present invention are used. For example, the detailed description herein describes a four layer circuit board, but the concepts of the disclosure can be applied to other multi-layer circuit board configurations, particularly such configurations having two or more copper foil ground patterns. In addition, one or more middle layers of the multi-layer circuit board may include a plurality of ground cut lines etched through a copper ground foil to segregate the ground portions of said copper foil into zones that may or may not match the zones of the top or bottom layers. It is, therefore, to be understood that the foregoing embodiments are presented by way of example only and that, within the scope of the appended claims and equivalents thereto; the invention may be practiced otherwise than as specifically described.

The invention claimed is:

1. A circuit board design for an inductive heater assembly, comprising:
   a multilayer circuit board for mounting a plurality of circuit components, the multilayer circuit board including:
      a top layer consisting of an etched copper foil on a core coated with an insulation layer, said top layer having a plurality of circuit trace lines and a plurality of vias, said top layer further including a plurality of ground cut lines etched through said copper foil to segregate the ground portions of the copper foil into zones for mounting respective circuit components;
      at least one middle layer on a core including a plurality of vias matching the plurality of vias of said top layer; and
      a bottom layer consisting of an etched copper foil on a core coated with an insulation layer, said bottom layer having a plurality of circuit trace lines and a plurality of vias, said plurality of vias matching the plurality of vias of said top layer, said bottom layer further including a plurality of ground cut lines etched through said copper foil to segregate the ground portions of the copper foil into zones.

2. The circuit board design of claim 1, wherein at least one of said top layer and said bottom layer further comprises at least one circuit trace line bounded by at least one of said ground cut lines for a substantial portion of its length.

3. The circuit board design of claim 1, wherein at least one of said top layer and said bottom layer further comprises at least one circuit trace line bounded between at least two of said ground cut lines for a substantial portion of its length.

4. The circuit board design of claim 3, wherein said at least one circuit trace line bounded between at least two of said ground cut lines conducts the high frequency AC signals from a zone of the circuit board allowing mounting of oscillator circuitry to another zone of the circuit board allowing mounting of driver circuitry of said inductive heater assembly.

5. The circuit board design of claim 1, wherein at least one of said ground cut lines on said top layer and at least one of said ground cut lines on said bottom layer are positioned at the same respective location on the multilayer circuit board.

6. The circuit board design of claim 1, wherein said ground cut lines on said top layer and said bottom layer segregate the top layer into a plurality of primary zones for cluster mounting the circuit components that provide various functions of the induction heater assembly.

7. The circuit board design of claim 1, wherein said zones for mounting respective circuit components on said top layer further comprise: a first primary zone for mounting power supply components; a second primary zone for mounting oscillator circuits; a third primary zone for mounting at least one transistor of a driver or amplifier circuit; and a fourth primary zone for mounting filter circuits including coil-capacitor circuit components.

8. The circuit board design of claim 1, wherein said ground cut lines on said top layer and said bottom layer segregate at least one of said primary zones into sub-zones of said circuit board, said sub zones configured to allow the mounting of discrete portions of the circuitry of the inductive heater assembly such that said discrete portions are segregated from one another by at least one of said ground cut lines.

9. The circuit board design of claim 1, wherein said at least one middle layer includes a plurality of ground cut lines etched through a copper ground foil to segregate the ground portions of said copper foil into zones.

10. The circuit board design of claim 1, further comprising vias for mounting posts of a transistor and posts of a heat sink associated with said transistor, said heat sink separated from said transistor by a thermal interface having a thickness sufficient to reduce capacitive coupling between said transistor and aid heat sink.

11. The circuit board design of claim 10, wherein said thermal interface has a thickness in the range of about 0.7 mm to 10. mm.

12. The circuit board design of claim 6, wherein said ground cut lines on said top layer and said bottom layer segregate at least one of said primary zones into sub-zones of said circuit board configured for the mounting of at least two coil-capacitor circuits to be mounted on said top layer, said ground cut lines configured to isolate the ground pattern of the coil-capacitors mounted on the top layer from one another.

13. A multilayer circuit board design for an inductive heater assembly, comprising:
a top layer having a ground foil pattern segregated by a plurality of ground cut lines defining a plurality of circuit mounting zones on said top layer of said multilayer circuit board;
a middle core having at least one middle layer;
a bottom layer having a ground foil pattern segregated by a plurality of ground cut lines defining a plurality of zones and providing conductive paths between said plurality of circuit mounting zones of said top layer;
at least one circuit trace line bounded between at least two of said ground cut lines, said at least one circuit trace line configured to conduct high frequency AC signals from one of said circuit mounting zones allowing mounting of oscillator circuitry to another of said circuit mounting zones allowing mounting of driver circuitry of said inductive heater assembly.

14. The circuit board design of claim 13 further comprising vias for mounting posts of a transistor and posts of a heat sink associated with said transistor, said heat sink separated from said transistor by a thermal interface having a thickness sufficient to reduce capacitive coupling between said transistor and aid heat sink.

15. The circuit board design of claim 14, wherein said thermal interface has a thickness in the range of about 0.7 mm to 10. mm.

16. The circuit board design of claim 14 wherein said thermal interface is made from a high hardness silicon rubber material suitable for acting as a thermal interface.

17. An inductive heater assembly having a multilayer circuit board for mounting the power control circuitry of the inductive heater, the multilayer circuit board comprising:
a top layer having a ground foil pattern segregated by a plurality of ground cut lines defining a plurality of circuit mounting zones on said top layer of said multilayer circuit board;
a middle core layer;
a bottom layer having a ground foil pattern segregated by a plurality of ground cut lines defining a plurality of zones and providing conductive paths between said plurality of circuit mounting zones of said top layer;
at least one circuit trace line bounded between at least two of said ground cut lines, said at least one circuit trace line configured to conduct high frequency AC signals from one of said circuit mounting zones allowing mounting of oscillator circuitry to another of said circuit mounting zones allowing mounting of driver circuitry of said inductive heater assembly.

18. The inductive heater assembly of claim 17, wherein the circuit board further comprising vias for mounting posts of a transistor and posts of a heat sink associated with said transistor, said heat sink separated from said transistor by a thermal interface having a thickness sufficient to reduce capacitive coupling between said transistor and aid heat sink.

19. The inductive heater assembly of claim 18, wherein the configuration of the multilayer circuit board results in the radio frequency interference (RFI) emissions of the inductive solder station are less than 30 dBµV/m in the frequency range from 30 MHz to 230 MHz and less than 37 dBµV/m in the frequency range from 230 MHz to 1 GHz.

20. The inductive heater assembly of claim 17, wherein said top layer of said circuit board further comprises: a first primary zone for mounting power supply components; a second primary zone for mounting oscillator circuits; a third primary zone for mounting at least one transistor of a driver or amplifier circuit; and a fourth primary zone for mounting filter circuits including coil-capacitor circuit components.

* * * * *